(12) United States Patent
Rämer et al.

(10) Patent No.: US 10,825,947 B2
(45) Date of Patent: Nov. 3, 2020

(54) RADIATION DETECTOR AND METHOD FOR PRODUCING SAME

(71) Applicant: FORSCHUNGSVERBUND BERLIN E.V., Berlin (DE)

(72) Inventors: Adam Rämer, Berlin (DE); Sergey Shevchenko, Berlin (DE)

(73) Assignee: FORSCHUNGSVERBUND BERLIN E.V., Berlin (DE)

( * ) Notice: Subject to any disclaimer, the term of this patent is extended or adjusted under 35 U.S.C. 154(b) by 0 days.

(21) Appl. No.: 16/312,771

(22) PCT Filed: Jan. 10, 2018

(86) PCT No.: PCT/EP2018/050501
§ 371 (c)(1),
(2) Date: Dec. 21, 2018

(87) PCT Pub. No.: WO2018/153557
PCT Pub. Date: Aug. 30, 2018

(65) Prior Publication Data
US 2019/0393374 A1 Dec. 26, 2019

(30) Foreign Application Priority Data

Feb. 23, 2017 (DE) .................. 10 2017 103 687

(51) Int. Cl.
| | | |
|---|---|---|
| *H01L 31/113* | (2006.01) | |
| *H01L 31/112* | (2006.01) | |
| *G01J 5/00* | (2006.01) | |
| *G01J 5/02* | (2006.01) | |
| *H01L 29/778* | (2006.01) | |

(Continued)

(52) U.S. Cl.
CPC ...... *H01L 31/1136* (2013.01); *H01L 31/1121* (2013.01); *G01J 5/0014* (2013.01);
(Continued)

(58) Field of Classification Search
None
See application file for complete search history.

(56) References Cited

U.S. PATENT DOCUMENTS

| | | | |
|---|---|---|---|
| 8,809,834 B2 * | 8/2014 | Ahn | ............ G02B 6/131 257/14 |
| 2006/0081889 A1 * | 4/2006 | Shur | ............ G02B 6/10 257/221 |

(Continued)

FOREIGN PATENT DOCUMENTS

| | | |
|---|---|---|
| DE | 10 2007 062 562 B4 | 10/2009 |
| DE | 10 2011 076 840 B4 | 8/2013 |

OTHER PUBLICATIONS

Bauer Maris et al: "High-Sensitivity Wideband THz Detectors Based on GaN HEMTs with integrated bow-tie antennas", 2015 10th European Microwave Integrated Circuits Conference, (EUMIC), EUMA, Sep. 2015, pp. 1-4.

(Continued)

*Primary Examiner* — Bo B Jang
(74) *Attorney, Agent, or Firm* — Norris McLAughlin, P.A.

(57) ABSTRACT

A radiation detector comprises an antenna structure; and a field effect transistor structure having a source region, a gate region, and a drain region, arranged on a substrate and forming mutually independent electrically conductive electrode structures through metallization, wherein the gate electrode structure completely encloses the source electrode structure or the drain electrode structure in a first plane; the enclosed electrode structure extends up to above the gate electrode structure and there overlaps the enclosure in a second plane above the first plane at least in sections in a planar manner; wherein an electrically insulating region for forming a capacitor with a metal-insulator-metal structure is (Continued)

arranged between the regions of the gate electrode structure overlapped by the enclosed electrode structure.

15 Claims, 10 Drawing Sheets

(51) Int. Cl.
   *H01Q 13/10* (2006.01)
   *H01Q 23/00* (2006.01)

(52) U.S. Cl.
   CPC ............ *G01J 5/02* (2013.01); *H01L 29/7786* (2013.01); *H01Q 13/10* (2013.01); *H01Q 23/00* (2013.01)

(56) References Cited

U.S. PATENT DOCUMENTS

2006/0239688 A1* 10/2006 Hillis .................... B82Y 20/00
                                                                 398/116
2011/0001173 A1    1/2011  Öjefors et al.
2014/0091376 A1    4/2014  Boppel et al.

OTHER PUBLICATIONS

M. Sakowicz et al: "Mechanism of Radiation Coupling to Plasma Wave Field Effect Transistor Sub-THz Detectors", Acta Physica Polonica: Series A, vol. 114, No. 5, Nov. 1, 2008, pp. 1337-1342.
Miriam S. Vitiello et al: "Room-Temperature Terahertz Detectors Based on Semiconductor Nanowire Field-Effect Transistors", Nano Letters, American Chemical Society, vol. 12, Jan. 2012, pp. 96-101.
Tanigawa T et al: "AlGaN/GaN Plasmon-Resonant Terahertz Detectors with On-Chip Patch Antennas", Lasers and Electro-Optics, 2009, pp. 1-2.
English Translation of International Search Report dated Mar. 20, 2018, dated Mar. 29, 2018.
International Search Report dated Mar. 20, 2018, dated Mar. 29, 2018.

* cited by examiner

RADIATION DETECTOR AND METHOD FOR PRODUCING SAME

The present invention relates to a radiation detector and a method for its manufacturing. In particular, the present invention relates to a radiation detector for the detection of i radiation based on a field effect transistor (FET) with an antenna structure monolithically integrated to the FET structure and a method for manufacturing such a monolithically integrated detector arrangement.

This application is the U.S. National Stage of International Application No. PCT/EP2018/050501, filed Jan. 10, 2018, which claims foreign priority benefit under 35 U.S.C. § 119 of German Application No. 10 2017 103 687.3.1 filed Feb. 23, 2017.

STATE OF THE ART

The term "terahertz frequency range" roughly refers to the frequency range from about 100 GHz to 30 THz. This range spans the free-space wavelengths from $\lambda=3$ mm to $\lambda=10$ µm, which is why it is also called the submillimeter wavelength range. In this range the energy of the photons is low, it is between 0.1 meV and 100 meV.

This range of the electromagnetic spectrum is also referred to as the THz gap, since it has hardly been explored for commercial applications to date. This is, among other things, due to the fact that in purely electronic systems the signals generated are in the range of noise. For purely photonic approaches, however, the energy of the photons is too low.

In the last decades highly complex systems have been developed which work in the submillimeter wavelength range. So far, these systems have only been used in experimental fields in research and development, such as radio astronomy, atmospheric research or the long-term spectroscopy of gases. However, these systems are not suitable for the breakthrough into the commercial mass market. This is mainly due to the lack of availability of low-cost sources and detectors for the THz range and their operation, mostly at temperatures below 77 K.

There is great interest in developing the THz frequency range as it has some advantages and uniqueness over other frequency ranges. THz radiation is non-ionizing and is therefore considered safe in the biomedical field. THz radiation can be used to obtain information about charge carrier dynamics in nanostructures. Many materials that are non-transparent in the optical frequency range are transparent in the THz frequency range. Certain molecule groups show a clear spectral fingerprint in the THz frequency range. This fingerprint is of particular interest for the detection of hazardous substances. Furthermore, THz radiation shows a lower scattering compared to optical frequencies and is therefore particularly suitable for the use in dusty environments. The high transmission bandwidth to be achieved speaks for the application in communication systems. The small wavelength of THz radiation enables high structural resolutions in radar-supported methods as well as the illumination and transillumination of samples, which is of particular interest, for example, for in-situ measurements in production processes for quality control.

For the detection of THz radiation in the lower THz frequency range (up to approx. 1 THz) purely electrical systems based on GaAs, SiGe, CMOS and InP semiconductor technologies are suitable, mostly with multiplier concepts. Furthermore, Schottky diode mixers and photoconductive detectors can be used for the detection of THz radiation. Photovoltaic detectors, Golay cells and bolometers are used as power detectors. Quantum cascade laser systems, optoelectronic systems based on femtosecond short pulse lasers or the mixing of two continuous wave lasers are mostly used to generate THz radiation above less THz.

In recent years it has been shown that transistors in the high-frequency range (1-80 GHz) are also suitable for the detection of THz radiation (T. Otsuji and M. Shur, "Terahertz Plasmonics: Good Results and Great Expectations," in IEEE Microwave Magazine, vol. 15, no. 7, pp. 43-50, November-December 2014). In particular, two mechanisms lead to the fact that such transistors can be used in the THz spectrum. These are on the one hand a resistive mixture in the active area of the transistor and on the other hand plasmonic effects in the active area of the transistor, which can be described by the Dyakonov-Shur theory (M. Dyakonov and M. Shur, "Detection, mixing, and frequency multiplication of terahertz radiation by two-dimensional electronic fluid," IEEE Trans. Electron Devices, vol. 43, no. 3, pp. 380-387, March 1996).

Primarily suitable for this type of detection of THz radiation are field effect transistors (FETs) in CMOS semiconductor technology (M. Bauer et al., "Real-time CMOS terahertz camera employing plane-to-plane imaging with a focal-plane array of field-effect transistors," 2013 38th International Conference on Infrared, Millimeter, and Terahertz Waves (IRMMW-THz), Mainz, 2013, pp. 1-2) and GaN semiconductor technology (M. Bauer et al., "High-sensitivity wideband THz detectors based on GaN HEMTs with integrated bow-tie antennas," Microwave Integrated Circuits Conference (EuMIC), 2015 10th European, Paris, 2015, pp. 1-4).

Different antenna types are used to detect and receive THz radiation. Especially Bowtie antennas, spiral antennas and patch antennas are used.

It is shown in DE 10 2007 062 562 B4 and DE 10 2011 076 840 B4 that at THz frequencies it is necessary to build the antenna and the transistor integrated on the same substrate. The transistor and the antenna are connected to each other by electrical supply lines, resulting in line losses and the antenna has to be adapted to the transistor. As a result, the detectors operate in a narrow band and achieve only suboptimal performance.

DISCLOSURE OF THE INVENTION

It is therefore an object of the present invention to indicate a monolithically integrable structure for the detection of the power and/or the phase of electromagnetic radiation in the THz frequency range. Furthermore, such a radiation detector arrangement should be featured by providing a closed, defined THz environment in which a frequency converter is monolithically embedded which converts the THz radiation into a low frequency range down to direct current. By means of a monolithically integrable structure, it shall in particular be possible to dispense with electrical supply lines, so that line losses are reduced and the antenna does not have to be adapted to the transistor with regard to the missing supply lines. This shall enable a large bandwidth with high sensitivity paired with a high integration density.

These objects are solved according to the invention by the features of patent claim 1 as well as patent claim 13. The appropriate embodiments of the invention are included in the respective subclaims.

A radiation detector according to the invention comprises an antenna structure and a field effect transistor (FET) structure having a source region, a gate region, and a drain region, wherein these regions are arranged on a substrate and form mutually independent electrically conductive electrode structures by metallization, wherein the gate electrode structure completely encloses the source electrode structure or the drain electrode structure in a first plane; the enclosed electrode structure extends up to above the gate electrode structure and there overlaps the enclosure in a second plane above the first plane at least in sections in a planar manner; wherein an electrically insulating region for forming a capacitor with a metal-insulator-metal structure (MIM structure) is arranged between the regions of the gate electrode structure overlapped by the enclosed electrode structure.

In general, radiation detectors are defined as technical arrangements which are designed to receive electromagnetic radiation and to output a corresponding detection signal related to the properties of the received radiation.

The antenna of a detection device for electromagnetic radiation generally has the task of receiving electromagnetic free-space waves incident on the antenna and converting them into guided conductor waves. For this purpose, an antenna usually has several receiving elements (e.g. the two arms of a classical dipole antenna). The tapping off of the received conductor wave can take place at the so-called antenna base point (also referred to as the central feed point). The term "antenna structure" takes into account the external geometry of all receiving elements, their mutual arrangement and their intrinsic structure (e.g. multi-layer structure) from the outer edge of the antenna to the antenna base point.

The electrical control of the different regions of a FET is typically performed via three mutually independent metallic electrodes, wherein the term "FET structure" describes the intrinsic structure of the FET with the elementary electrode structures, i.e. without an antenna structure. The electrodes are arranged above the individual regions of the FET (i.e. above the FET structure) mostly through the deposition or application of metals or metal-containing compounds.

The term "electrode structure" takes into account both the external geometry of the electrodes and their intrinsic structure (e.g. structure of the electrode from different layers or electrode elements). Electrically directly interconnected regions can form a coherent electrode structure. Preferably, the source-electrode structure can comprise an ohmic source contact and a source metallization. Preferably, the drain electrode structure can comprise an ohmic drain contact and a drain metallization. The gate electrode structure can comprise different metallization planes and a gate metallization. Preferably, the gate electrode structure is completely formed by a gate metallization. A metallization can take place particular by the application of pure metals, compound metals or other electrically conductive metallic compounds.

A capacitor generally consists of two mutually electrically insulated surface elements (e.g. plate capacitors) on which electrical charges can be stored. These surfaces are also referred to as capacitor electrodes. In semiconductor technology, the term metal-insulator-metal structure (MIM structure) is used above all to describe capacitive metal layer stacks formed in a planar manner with an intermediate insulation layer (electrically insulating region). The insulation layer can be for example a silicon oxide, silicon nitride or any other electrically insulating material or medium. According to the invention, an electrically insulating region, to form a capacitor with a MIM structure, is arranged between the regions of the gate electrode structure overlapped by the enclosed electrode structure.

Preferably, the antenna structure, placed on the substrate, is directly formed by electrode structures. This means that the antenna structure represents an essentially planar antenna implementation, wherein the electrode structures of the FET itself can be formed as receiving elements of the antenna structure. An epitaxial structure is preferably arranged between the antenna structure and the substrate. The antenna structure can, however, can also be formed at least in sections directly placed on the substrate.

Particularly preferred, the antenna structure is formed directly by the source electrode structure and the drain electrode structure. Preferably, the MIM capacitor of at least a part of the gate electrode structure is formed by a region overlapping with at least a part of the source electrode structure or with at least a part of the drain electrode structure. The antenna structure, however, can also be formed at least in sections over the gate electrode structure.

The idea of the present invention therefore consists in arranging the antenna structure in the direct vicinity of the transistor, wherein electrical supply lines and the disadvantages associated with them can be completely dispensed with. In particular, the antenna structure can also be formed directly by the corresponding electrode structures of the transistor in order of a maximum distance minimization. Through the integration of a capacitor into the antenna or FET structure, which is also possible, a common RF environment can be formed that can be configured to tune the radiation detector to the reception of electromagnetic waves in the THz range. Since the gate electrode structure completely encloses the source electrode structure or the drain electrode structure in a first plane, a more broadband short-circuit can be realized than with one-sided electrode structure embodiments. Due to a particularly short enclosing distance, no transformation of the short-circuit to high impedance values takes place at high frequencies. Furthermore, an enclosure leads to a particularly high RF decoupling of the drain and source regions. In particular, the gate region represents the RF reference potential of the arrangement. Since the high-frequency currents flowing to the gate region predominantly occur in an annular manner at the edges of the enclosure (skin effect), the far field of the antenna is not significantly disturbed by the current flow in the enclosure, even at high frequencies.

Since such a radiation detector according to the invention is both a receiving element and a detector element, this concept enables a large bandwidth with high sensitivity, paired with a high integration density. Since the structure can be fabricated in a standard semiconductor process, it is also relatively easy to manufacture and inexpensive. Thus, the underlying concept enables the design of structures for mass market applications in the area of THz radiation. The basis of a radiation detector according to the invention is therefore a field effect transistor (FET) with its three electrodes Source, Gate and Drain, wherein the electrodes can be shaped in such a way that they generate a precisely defined RF environment.

Preferably the ohmic source contact and the ohmic drain contact have a height between 0.1 µm and 0.5 µm. More preferred is a height of about 0.25 µm. A preferred length of the ohmic source contact is greater than 3 µm. More preferred is a length between 4 µm and 6 µm. Preferably the ohmic source contact and the ohmic drain contact have a width greater than 1 µm. More preferred is a width between 3 µm and 4 µm.

In some embodiments, the width of the ohmic source contact 34a and the ohmic drain contact 38a may differ from one another in the region of the FET structure 20.

Preferably the ohmic source contact has a width of about 4 µm and the ohmic drain contact has a width of about 1 µm. Further preferred are embodiments in which the ohmic source contact has a width of about 10 µm and the ohmic drain contact has a width of about 1 µm. More preferred for such asymmetrical designs are asymmetry ratios (width of the ohmic source contact to width of the ohmic drain contact) of between 1:2 and 1:10, more preferred between 1:4 and 1:10, even more preferred between 1:6 and 1:10.

Preferably, the gate electrode structure has a height between 0.3 µm and 0.5 µm. More preferred is a height of about 0.35 µm. Preferably, the source metallization in the region of the capacitor has a height between 0.5 µm and 1.2 µm. More preferred is a height of about 0.65 µm. Preferably, the source metallization and the drain metallization in the region of the capacitor have a width greater than 3 µm. More preferred is a width between 4 µm and 6 µm.

Preferably the electrically insulating region has a height between 0.01 µm and 0.5 µm. More preferred is a height of about 0.2 µm.

Preferably, the gate electrode structure in the first plane and the enclosing electrode structure in the second plane overlap essentially as rectangular surface elements. The overlap forming the MIM capacitor, wherein the overlap refers to the common surface resulting from a vertical projection of the mutually facing surfaces of the gate electrode structure and the enclosing electrode structure, can be regarded in analogy to the two capacitor electrodes (arranged parallel to one another) of a classical plate capacitor. The term "essentially" refers to a generally rectangular shape of the overlapping surface elements. The shape of the individual electrode structures can differ from this.

Preferably, the FET structure is based on silicon or a III-V semiconductor. Accordingly, it is preferred that the FET structure is implemented in Si-based technology (e.g. CMOS). Furthermore, it is preferred that the FET structure is implemented in III-V technology. Particularly preferred technologies for the design of the FET structure or of a radiation detector according to the invention can be based on GaN, graphene or high-temperature superconductors (also called HTC superconductors). Preferably, the substrate used to the design of said structures does not form a ground surface with respect to the antenna element. Especially highly conductive silicon can be used as substrate material.

Preferably the base point of the antenna structure is arranged between the gate region and the source region or between the gate region and the drain region. More preferred is that the base point of the antenna structure is arranged between the gate region and the source or drain region of the non-enclosed electrode structure. In particular, the base point of the antenna structure can be arranged exactly in the middle between these two regions. This allows an electromagnetic wave (e.g. a free-space wave) received by the antenna structure to be coupled directly into the FET at the antenna base point. Additional conductor paths, in which received radiation waves in the state of the art would have to be guided as line waves in antenna supply lines, can thus be dispensed with. A detection of the radiation received from the antenna structure can therefore take place directly at the base point of the antenna structure without additional line losses.

Preferably, the antenna structure forms a slot antenna, wherein the antenna structure has at least one radiating opening within a metal surface (such antenna structures are commonly referred to as slot antenna regardless of the specific shape of the radiating opening). Slot antennas are antennas in which the radiating element of the antenna is essentially formed by an opening (commonly referred to as a radiating opening/aperture) in a conductive plane. To such a radiating opening, the radiation or reception characteristics of a classical dipole (complementary dipole with the same intensity distribution) can be assigned according to Babinet's theorem in the far field. The currents induced by a stimulating electromagnetic field essentially flow along the metallic edge of the opening. The term "radiating opening" is thus to be understood in particular as an opening within an assigned antenna structure, which represents a complementary dipole as receiving element for this antenna structure according to Babinet's theorem. The coupling of electromagnetic signals to be received into the antenna structure can preferably take place via the substrate.

The metal surface can be an individual metallic surface or a composite metallic surface consisting of individual elements. The individual elements can be galvanically separated from each other, wherein the separation can be formed by additional MIM capacitors between individual elements. Preferably, MIM capacitors between individual elements lead to a galvanic separation in which an RF connection is maintained between the individual elements separated by a MIM capacitor. In particular, it is preferred that a radiating opening is used in the metallizations of the electrode structures as the receiving element of the antenna and that the entire structure is enclosed by a radio-frequency connected mass. Here it is particularly preferred that on the outer edge of the antenna structure radio frequency currents (RF currents) with frequencies greater than 100 GHz are short-circuited. This allows the structures to be arranged as an array without disturbing their neighbors. On the other hand, the RF signals on the connecting lines (leading to the outside) of the radiation detector can also be suppressed. In the case of a slot antenna, the inversion of air and metal results in greater design freedom for the realization of the short-circuit and for the embodiment of the different electrode arrangements.

In particular, it is preferred that the antenna structure realizes an RF short-circuit between 2 of the 3 regions of the FET structure. In particular it is preferred that the gate and source electrode structures (or the gate and drain electrode structures) are arranged as MIM structures on top of each other in a large surface in relation to the spatial dimensions of the FET structure, in order to realize an ideal RF short-circuit between the intrinsic gate and source regions (or the gate and drain regions). Preferably, the surface overlapped by the MIM structure on the substrate exceeds the surface overlapped by the 2DEG of the FET structure on the substrate by a factor of 100, more preferably by a factor of 1,000, even more preferably by a factor of 10,000.

Particularly preferred embodiments of an antenna structure are resonant hole antennas, teardrop antennas, slot patch antennas, slot bowtie antennas and slot log spiral antennas. An antenna structure can preferably be formed in 2-arm or 4-arm manner. In the case of an antenna structure formed in a 4-arm manner, in particular two mutually independent FET structures can use a common antenna structure as a receiving element or a radiation detector according to the invention comprises two FET structures connected in parallel on a common substrate, wherein in both cases each FET structure is connected to two arms each of the antenna structure formed in a 4-arm manner. In general, a plurality of individual FET structures or FET structures connected in parallel can be used for multi-arm antenna structures. Furthermore, there may be mixed forms, where in a multi-armed antenna structure individual arms are assigned to individual FET structures and other arms lead to FET structures connected in parallel.

Preferably, the capacitor and the antenna structure form a common RF environment, adapted to tune the radiation detector to the reception of electromagnetic waves in the THz range. In particular, the reception characteristics (sensitivity, spectral bandwidth, signal amplification) of a radiation detector according to the invention can be tuned or adjusted by corresponding dimensioning of the antenna structure and by adjusting the capacitance of the capacitor. This enables a radiation detector according to the invention to be optimized for a large number of applications within the scope of the present disclosure. However, these applications are not restricted to the THz radiation range.

Preferably, a radiation detector according to the invention also comprises a frequency converter, wherein the frequency converter converts the received radiation into a low-frequency detection signal. The evaluation of the radiation detector according to the invention is preferably performed by a low-frequency evaluation of the currents or voltages between the source and drain electrodes. In particular, an active semiconductor, which converts the THz radiation into a low frequency range down to direct current, can be monolithically embedded within the radiation detector according to the invention.

A further aspect of the present invention relates to a method of manufacturing a radiation detector. The method according to the invention comprises providing a field effect transistor (FET) structure arranged on a substrate having a gate region, a source region and a drain region; metallizing of the gate region, of the source region and of the drain region, wherein mutually independent electrically conductive electrode structures are formed, wherein through the gate electrode structure, either the source electrode structure or the drain electrode structure is completely enclosed in a first plane, wherein the enclosed electrode structure is extended up to above the gate electrode structure and, through the enclosed electrode structure, the enclosure in a second plane above the first plane is overlapped at least in sections in a planar manner, wherein an electrically insulating region for forming a capacitor with a metal-insulator-metal, MIM-, structure is arranged between the regions of the gate electrode structure overlapped by the enclosed electrode structure; and structuring of an antenna structure arranged on the substrate, wherein the antenna structure, placed on the substrate, is formed directly by the electrode structures, wherein a radiating opening is formed within a metal surface of the antenna structure, and wherein the base point of the antenna structure is arranged between the gate region (26) and the source region (24) or between the gate region (26) and the drain region (28). Preferably, the base point of the antenna structure is arranged between the gate region and the source or drain region of the non-enclosed electrode structure.

The method according to the invention is suitable for providing particularly preferred embodiments of a radiation detector according to the invention. Appropriate embodiments of the invention are contained in the subclaims.

Preferably, the antenna structure is formed in a 2-arm or 4-arm structured manner. Likewise only preferably, the capacitor and the antenna structure can be tuned in their resonant frequencies to the reception of electromagnetic waves in the THz range in order to form a common RF environment.

BRIEF DESCRIPTION OF THE DRAWING

The invention is illustrated in the following embodiments on the basis of the corresponding drawing. In particular.

DETAILED DESCRIPTION OF THE DRAWINGS

Figure 1:
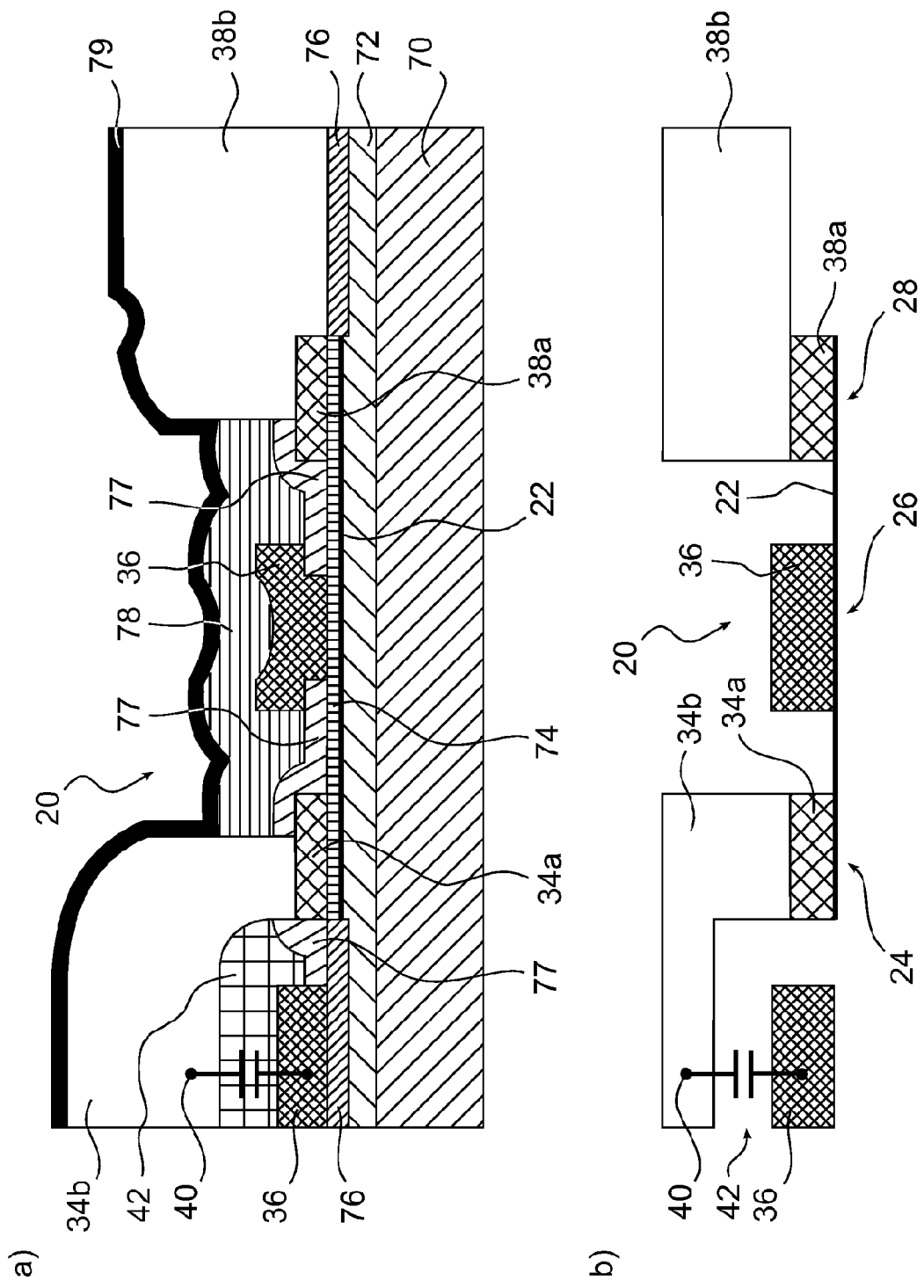
FIG. 1a shows a schematic design of an exemplary embodiment of a FET structure according to the invention in the side view.
FIG. 1b shows an abstract schematic design of a FET structure according to the invention in side view

FIG. 1a shows a schematic design of an exemplary embodiment of a FET structure 20 according to the invention in the side view. In the case of other embodiments of the invention, the concrete formation as well as the mutual arrangement of the represented elements in particular may deviate from the structure shown here. Likewise, the representation shown does not suggest any concrete layer structure or a specific method for manufacturing the corresponding layer structure. The FET structure 20 according to the invention can be varied at will within the scope of this disclosure and is in no way limited by the representation shown.

The embodiment shown is based on an epitaxial structure suitable for the manufacturing of FETs and has a substrate 70 (e.g. made of SiC) with a buffer layer 72 (e.g. a GaN buffer layer) arranged on it. An active area 74 (e.g. made of AlGaN) is arranged on the buffer layer 72. The active area 74 is laterally limited by an insulation layer 76. In the case of a FET, a control of the current flow takes place within the active area 74. In general during operation of the FET, a 2-dimensional electron gas, which is referred to as 2DEG 22, forms in the boundary region between the active area 74 and the buffer layer 72. An electronic control of the active area 74 takes place from above the active area 74 via three mutually independent, electrically conductive electrodes, which are typically referred to as gate, source and drain. Accordingly, these electrodes have a source electrode structure 34, a gate electrode structure 36 and a drain electrode structure 38. Through the electrodes, a source region 24, a gate region 26 and a drain region 28 are defined in the active area 72 or within the 2DEG 22. A typical value for the length of the gate region 26 is about 100 nm, wherein the gate electrode structure 36 in the region above the gate region 26 typically has a length of about 200 nm. Typical lengths for the distance between the gate metallization 36 and the ohmic source contact 34a or between the gate metallization 36 and the ohmic drain contact 38a are between 0.1 µm and 1 µm. Here both symmetrical and asymmetrical embodiments can be realized.

The individual electrode structures 34, 36, 38 can consist of a single layer or a uniform material (preferably an electrically conductive metallic material) or be composed of a layering or combination of different materials. In particular, the representation shows a gate electrode 36 consisting of a uniform material (e.g. an alloy of different metals). The source electrode structure 34 and the drain electrode structure 38, on the other hand, are layered on top of each other. The source electrode structure 34 is composed of an ohmic source contact 34a placed directly on the active area 74 and a source metallization 34b arranged directly above it (e.g. by vapor deposition or deposition, in particular of Au). Accordingly, the drain-electrode structure 38 is composed of an ohmic drain contact 38a placed directly on the active area 74 and a drain metallization 38b arranged directly above it. In order to electrically isolate or protect the individual electrode structures 34, 36, 38 from each other, in the upper region of the representation, the electrode structures 34, 36, 38 are framed or mutually separated by several passivation layers 77, 78, 79.

Below the source metallization 34b, an electrically insulating region 42 (dielectric) is arranged according to the invention. The insulating region 42 can, for example, be an insulating layer or a free region (e.g. an air gap). Below the drawn insulating region 42 a continuation of the gate electrode structure 36 is situated. These are sections of one and the same gate electrode structure 36. In particular, the two sections are electrically conductively connected to each other, wherein this connection cannot be seen from the side view shown.

Between the regions of the gate electrode structure 36 overlapped by the source metallization 34b, i.e. the section of the gate electrode structure 36 shown on the left in the representation, an electrically insulating region 42 is thus arranged. The hereby generated metal-insulator-metal-layer (MIM-layer) forms a capacitor 40 with a corresponding MIM-structure. To illustrate the structural relationships, the conventional technical circuit symbol for a capacitor is drawn into the schematic design at the corresponding location.

FIG. 1b shows an abstract schematic design of a FET structure 20 according to the invention in the side view. In contrast to the FIG. 1a, it is a representation reduced to the essential elements of the FET structure 20 with an increased degree of abstraction. An explicit representation of possible insulation layers, carrier layers and intermediate layers was dispensed with. In particular, the design shown can be an abstract representation of the exemplary embodiment of a FET structure according to invention in the side view as shown in FIG. 1a. The respective reference signs and their assignment therefore apply accordingly.

Figure 2:
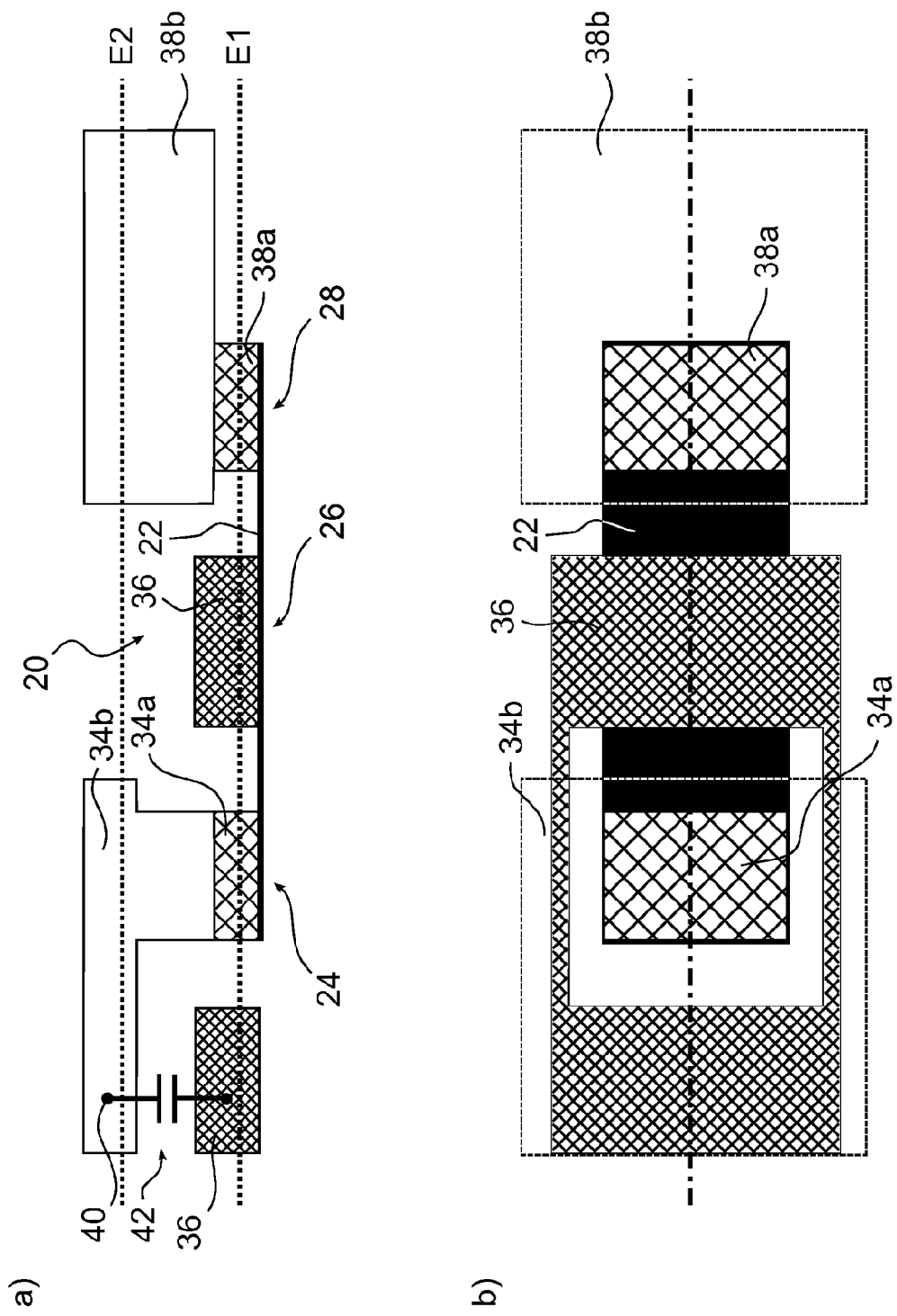
FIG. 2a, 2b shows an abstract schematic design of a FET structure according to the invention according to FIG. 1b in the side view (a) and in the top view (b)

FIG. 2a shows an abstract schematic design of a FET structure 20 according to the invention according to FIG. 1b in side view. The respective reference signs and their assignment apply accordingly. Furthermore a first plane E1 and a second plane E2 are drawn, wherein the second plane E2 is arranged above the first plane E1.

FIG. 2b shows an abstract schematic design of an exemplary embodiment of a FET structure 20 according to the invention according to FIG. 2a in the top view. The dashed-dot line drawn in FIG. 2b indicates an intersection line leading to a side view shown in FIG. 2a.

FIGS. 2a and 2b thus show a FET structure 20 with a source region 24, a gate region 26, and a drain region 28, wherein these regions 24, 26, 28 form mutually independent electrically conductive electrode structures 34, 36, 38 through metallization; wherein the gate electrode structure 36 completely encloses the source electrode structure 34 in a first plane E1; the enclosed source electrode structure 34 extends up to above the gate electrode structure 36 and there overlaps the enclosure in a second plane E2 above the first plane E1 at least in sections in a planar manner (in the region marked in hatched bordered manner of the source metallization 34b); wherein an electrically insulating region 42 for forming a capacitor 40 with a MIM structure is arranged between the regions of the gate electrode structure 36 (essentially the region marked by the hatched bordered source metallization 34b of the gate electrode structure 36) overlapped by the enclosed source electrode structure 34.

The gate electrode structure 36 in the first plane E1 and the enclosed source electrode structure 34 in the second plane E2 overlap each other in the shown representation essentially as rectangular surface elements (left-sided rectangular section of the two-part connected gate electrode structure 36). However, dashed borders, particularly in the case of source metallization 34b, shall indicate that these regions can extend further than drawn in. In other embodiments, the geometric dimensions (lengths, heights and/or widths) of the source electrode structure 34 and of the gate electrode structure 38 can be varied individually and in relation to each other to form an adapted RF environment or to adapt the RF environment to a specific antenna structure 10. In particular, the ohmic source contact 34a and the ohmic drain contact 38a can respectively have different widths, wherein the width corresponds to the dimension visible only in a top view (the height corresponds to the height in a side view).

Furthermore, according to the invention, the drain electrode structure 38 can also be enclosed instead of the source electrode structure 34.

Figure 3:
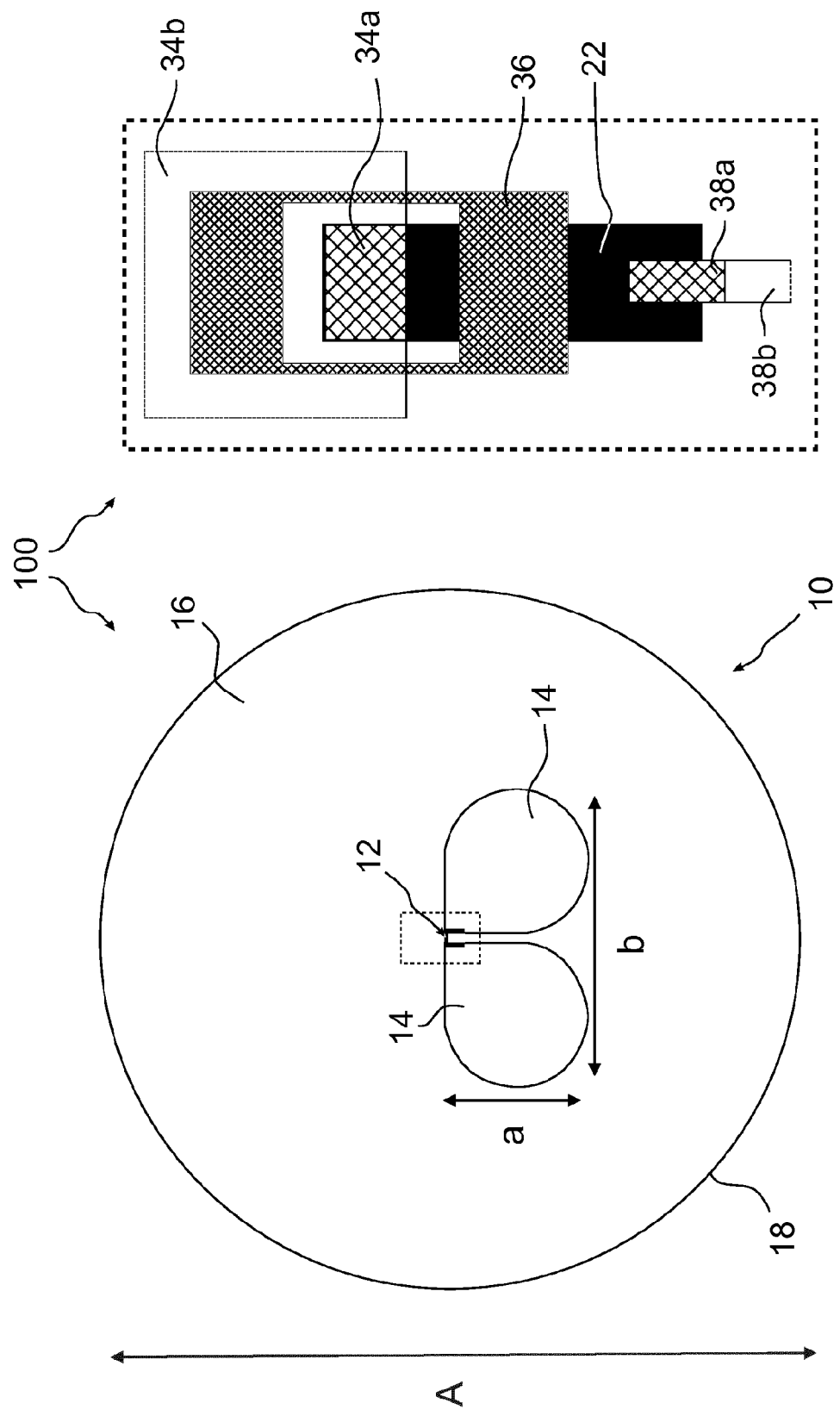
FIG. 3 shows a schematic design of a first embodiment of the invention (hole antenna)

FIG. 3 shows a schematic design of a first embodiment of the invention (hole antenna). In particular, the representation shows a preferred antenna structure 10 of a radiation detector 100 according to the invention. The antenna structure 10, placed on a substrate 70, can be formed directly by electrode structures 34, 36, 38. Preferably an epitaxial structure (e.g. the epitaxial structure shown in FIG. 1a) is arranged between the antenna structure and the substrate. Preferably the antenna structure 10 is formed directly by the source electrode structure 34 and/or by the drain electrode structure 38.

The base point 12 of the antenna structure 10 can be arranged between the gate region 26 of the gate electrode structure 36 and the drain region 28 of the drain electrode structure 38. The antenna structure 10 has two approximately circular openings 14 within a metal surface 16, wherein a narrow strip extends in the region between the two openings 14. As shown in the adjacent abstract schematic representation of the FET structure 20 enlarged from the inner region of the antenna structure 10, this part of the metal surface 16 is formed directly by the drain metallization 38b and thus belongs to the drain electrode structure 38. The upper semi-circular part region of the metal surface 16, on the other hand, is formed directly by the source metallization 34b and thus belongs to the source electrode structure 34.

As can also be seen from the representation shown, the width of the ohmic source contact 34a and of the ohmic drain contact 38a differ from each other in the region of the FET structure 20.

Preferably the ohmic source contact 34a and the ohmic drain contact 38a have a height between 0.1 µm and 0.5 µm. More preferred is a height of about 0.25 µm. A preferred length of the ohmic source contact 34a is greater than 3 µm. More preferred is a length between 4 µm and 6 µm.

Preferably the ohmic source contact 34*a* and the ohmic drain contact 38*a* have a width greater than 1 µm. More preferred is a width between 3 µm and 4 µm.

Preferably the gate electrode structure 36 has a height between 0.3 µm and 0.5 µm. More preferred is a height of about 0.35 µm. Preferably the source metallization 34*a* in the region of the capacitor 40 has a height between 0.5 µm and 1.2 µm. More preferred is a height of about 0.65 µm. Preferably the source metallization 34*b* and the drain metallization 38*b* in the region of the capacitor 40 have a width greater than 3 µm. More preferred is a width between 4 µm and 6 µm.

Preferably the electrically insulating region 42 has a height between 0.01 µm and 0.5 µm. More preferred is a height of about 0.2 µm.

The shown antenna structure 10 is characterized in particular by the circular shape of the openings 14. The capacitor 40 and the antenna structure 10 can form a common RF environment, which is adapted to tune the radiation detector 100 according to the invention to the reception of electromagnetic waves in the THz range. In particular, the shown antenna structure 10 with an Au metal surface 16, a first opening section a of about 14.6 µm, a second opening section b of about 30 µm and a variable antenna section A can be tuned to the spectral range around about 1 THz. Preferably, 10 RF currents with frequencies greater than 100 GHz are short-circuited on the outer edge 18 of the antenna structure. Through the antenna structure 10 an RF short-circuit between 2 of the 3 regions 24, 26, 28 of the FET structure 20 is realized. In particular, through the antenna structure 10 an RF short-circuit between the source region 24 and the drain region 28 of the FET structure 20 can be realized.

Figure 4:
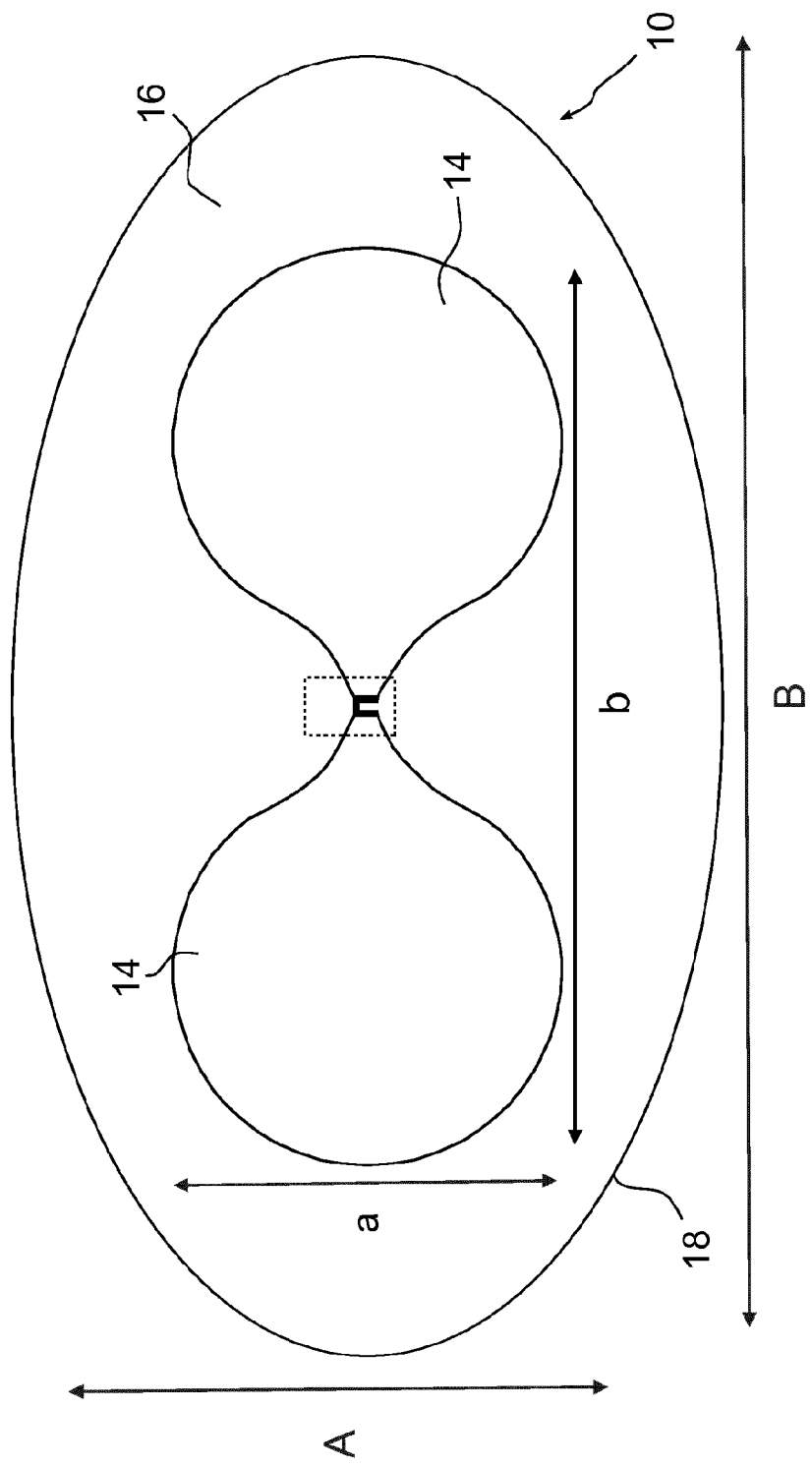
FIG. 4 shows a schematic design of a second embodiment of the invention (teardrop antenna)

FIG. 4 shows a schematic design of a second embodiment of the invention (teardrop antenna). With the exception of the antenna type, the representation shown corresponds essentially to the representation shown in FIG. 3. The reference signs and their assignment apply accordingly. An abstract schematic representation of the FET structure 20 enlarged from the inner region of the antenna structure 10 was dispensed with; this can be seen analogously in FIG. 3.

The shown antenna structure 10 is characterized in particular by an elliptical shape of the outer edge 18 and a tear-shaped shape of the openings 14. The capacitor 40 and the antenna structure 10 can form a common RF environment, which is adapted to tune the radiation detector 100 to the reception of electromagnetic waves in the THz range. In particular, with the antenna structure 10 shown, with an Au metal surface 16, a first opening section a of about 60 µm, a second opening section b of about 195 µm, a first antenna section A of about 125 µm and a second antenna section B of about 275 µm, a broadband tuning of the reception properties to the spectral range between about 400 GHz and 2 THz can take place.

Figure 5:
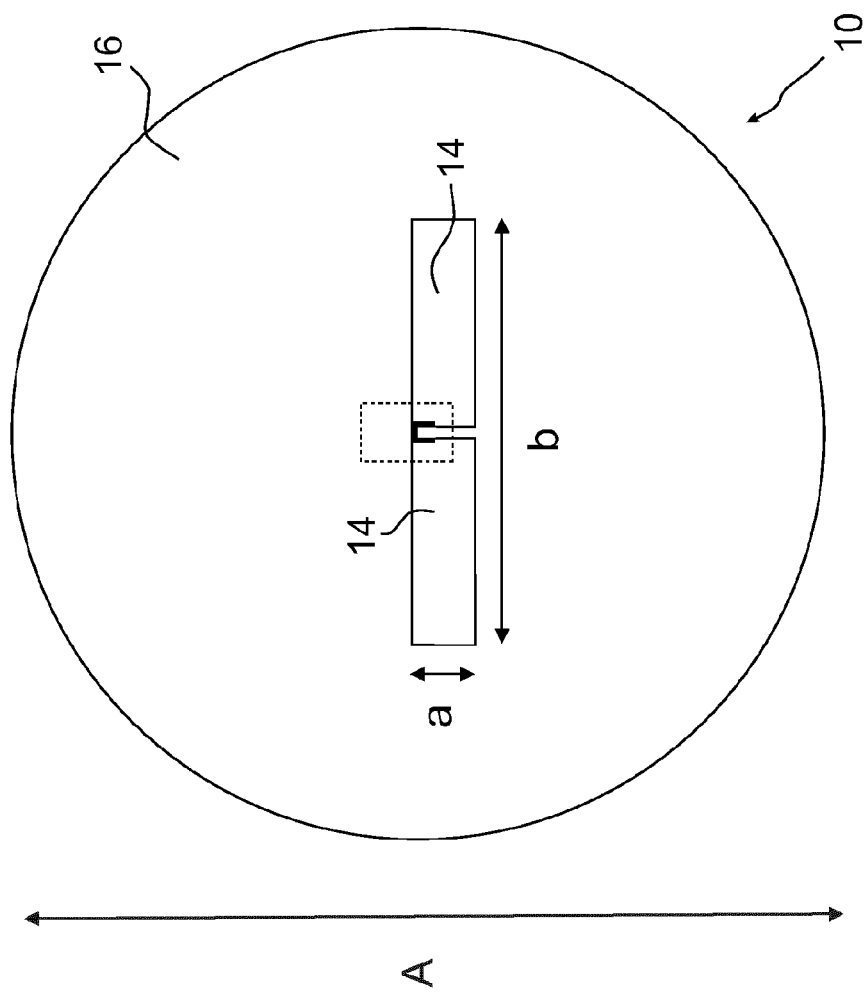
FIG. 5 shows a schematic structure of a third version of the invention (slot patch antenna)

FIG. 5 shows a schematic design of a third embodiment of the invention (slot patch antenna). With the exception of the antenna type, the representation shown corresponds essentially to that shown in FIG. 3. The reference signs and their assignment apply accordingly. An abstract schematic representation of the FET structure 20 enlarged from the inner region of the antenna structure 10 was dispensed with; this can be seen analogously in FIG. 3.

The shown antenna structure 10 is characterized in particular by the stretched shape of the openings 14. The capacitor 40 and the antenna structure 10 can form a common RF environment, which is adapted to tune the radiation detector 100 according to the invention to the reception of electromagnetic waves in the THz range. In particular, with the shown antenna structure 10 with an Au metal surface 16, a second opening section b of about 94 µm and a first antenna section A of about 155 µm and a second antenna section B of about 275 µm, a tuning of the reception characteristics to the spectral range around about 600 GHz can take place.

Figure 6:
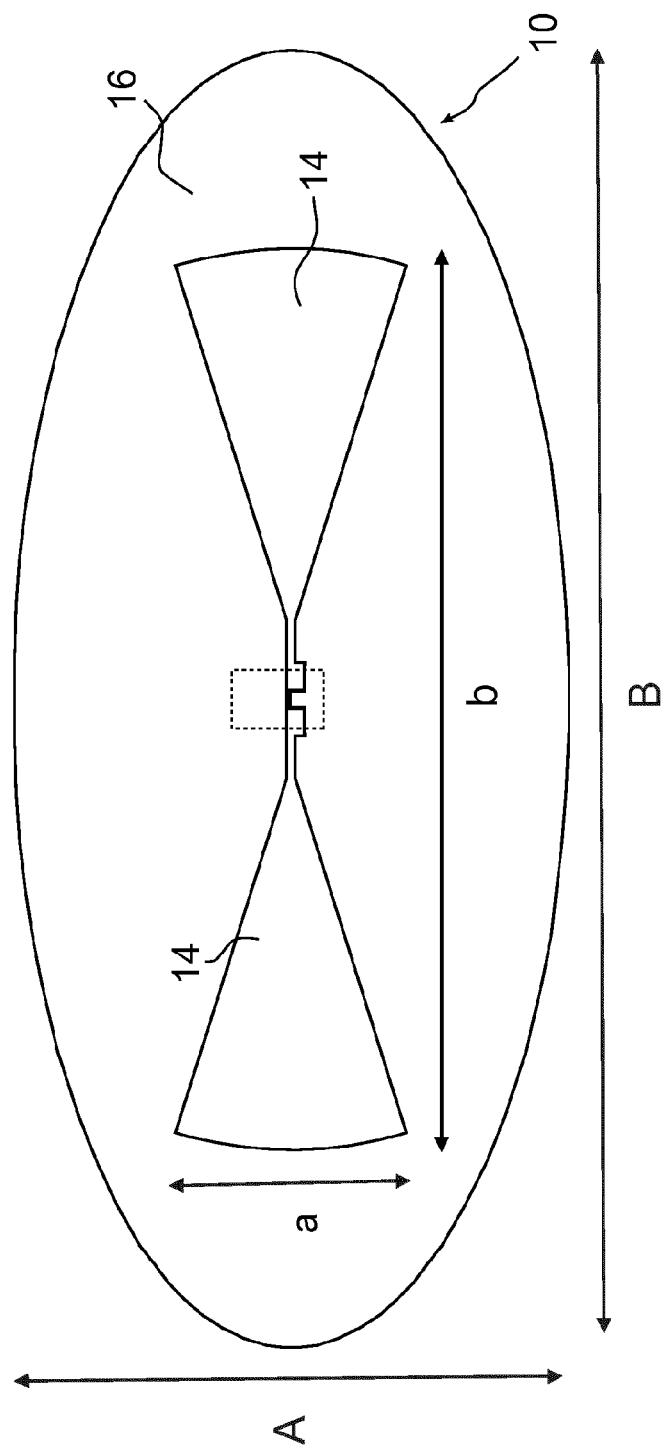
FIG. 6 shows a schematic design of a fourth embodiment of the invention (slot bowtie antenna, variant 1)

FIG. 6 shows a schematic design of a fourth embodiment of the invention (slot bowtie antenna, variant 1). With the exception of the antenna type, the representation shown corresponds essentially to the representation shown in FIG. 3. The reference signs and their assignment apply accordingly. An abstract schematic representation of the FET structure 20 enlarged from the inner region of the antenna structure 10 was dispensed with; this can be seen analogously in FIG. 3.

The shown antenna structure 10 is characterized in particular by a stretched, in two directions extending shape of the openings 14. The capacitor 40 and the antenna structure 10 can form a common RF environment, which is adapted to tune the radiation detector 100 to the reception of electromagnetic waves in the THz range. In particular, with the shown antenna structure 10 with an Au metal surface 16, a first opening section a of about 146 µm, a first antenna section A of about 90 µm and a second antenna section B of about 210 µm, a broadband tuning of the reception characteristics to the spectral range between about 500 GHz and 2 THz can take place.

Figure 7:
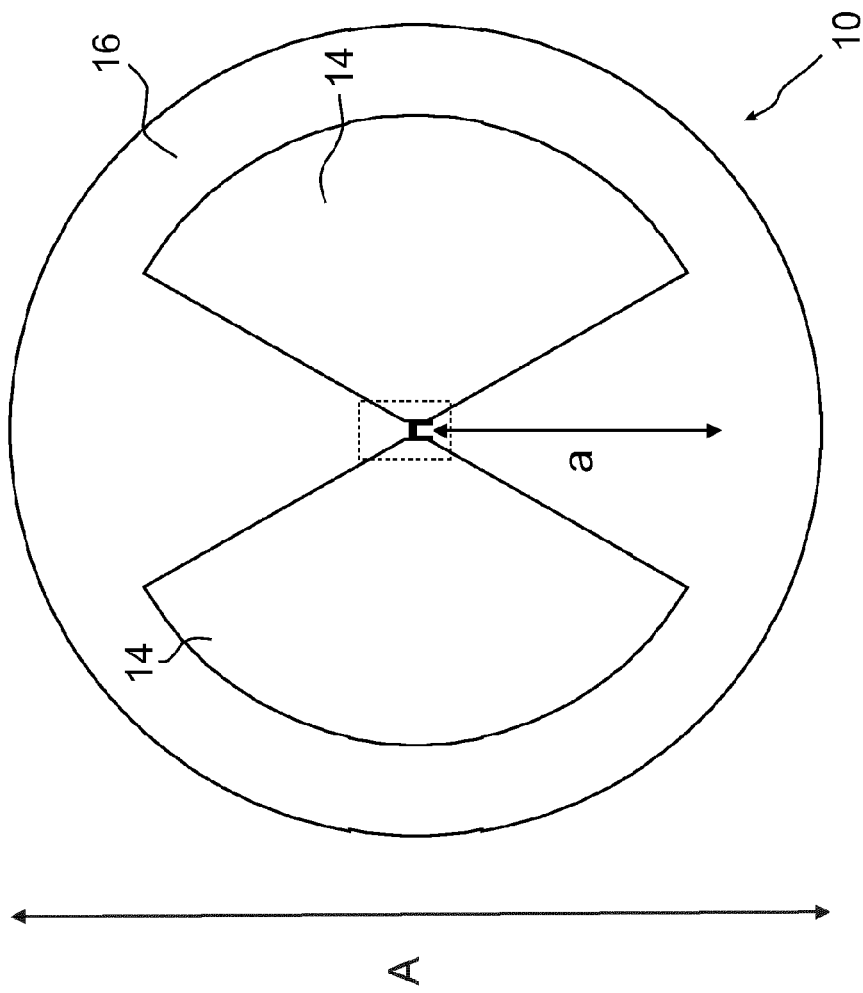
FIG. 7 shows a schematic design of a fifth embodiment of the invention (slot bowtie antenna, variant 2)

FIG. 7 shows a schematic design of a fifth embodiment of the invention (slot bowtie antenna, variant 2). With the exception of the antenna type, the shown representation essentially corresponds to the representation shown in FIG. 3. The reference signs and their assignment apply accordingly. An abstract schematic representation of the FET structure 20 enlarged from the inner region of the antenna structure 10 was dispensed with; this can be seen analogously in FIG. 3.

The shown antenna structure 10 is characterized in particular by a partially circular, in two directions extending shape of the openings 14. The capacitor 40 and the antenna structure 10 can form a common RF environment, which is adapted to tune the radiation detector 100 to the reception of electromagnetic waves in the THz range. In particular, with the shown antenna structure 10 with an Au metal surface 16, a first opening section a of about 140 µm and a first antenna section A of about 360 µm, a broadband tuning of the reception characteristics to the spectral range between about 400 GHz and 2 THz can take place.

Figure 8:
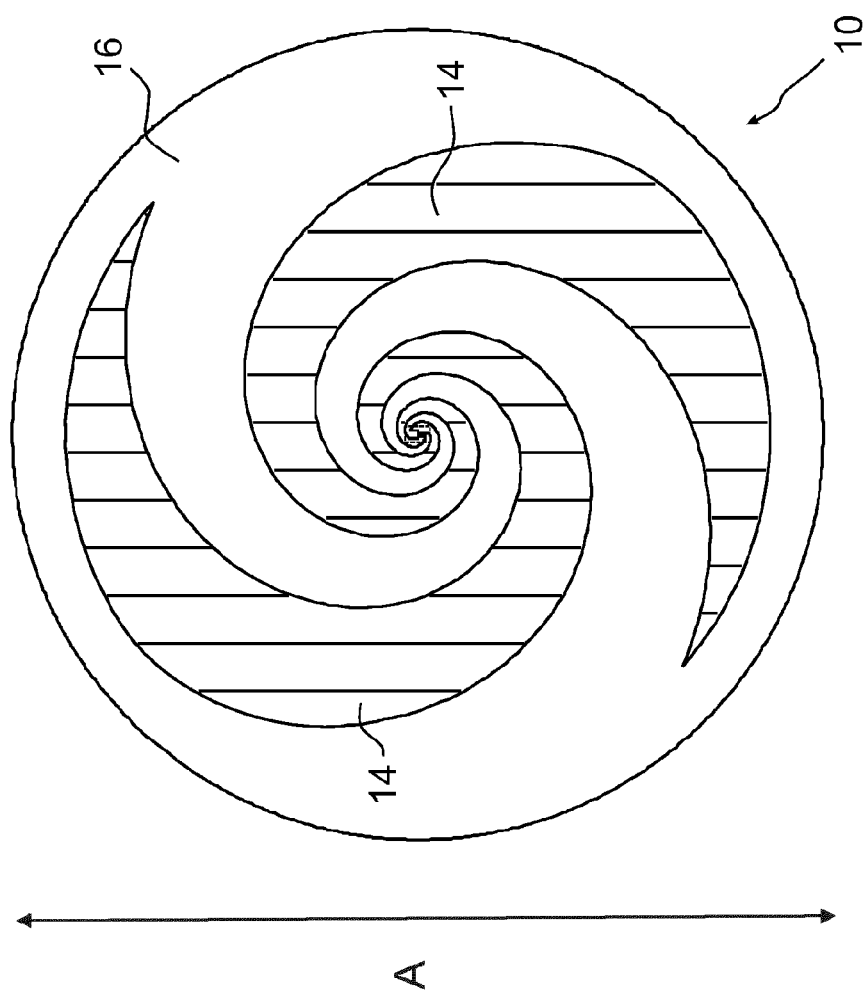
FIG. 8 shows a schematic design of a sixth embodiment of the invention (slot log spiral antenna)

FIG. 8 shows a schematic design of a sixth embodiment of the invention (slot log spiral antenna). With the exception of the antenna type, the shown representation essentially corresponds to the representation shown in FIG. 3. The reference signs and their assignment apply accordingly. The abstract schematic representation of the FET structure 20 enlarged from the inner region of the antenna structure 10 was dispensed with; this can be seen analogously in FIG. 3. For a better visualization of the spiral structure, the region of the openings 14 is displayed hatched.

The shown antenna structure 10 is characterized in particular by a shape of the openings 14 extending spirally around the base point 12 of the antenna structure 10. The capacitor 40 and the antenna structure 10 can form a common RF environment, which is adapted to tune the radiation detector 100 to the reception of electromagnetic waves in the THz range. In particular, with the shown antenna structure 10 with an Au-metal surface 16 and a first antenna section A of about 610 µm, a broadband tuning of the reception characteristics to the spectral range between about 300 GHz and 3 THz can take place.

Figure 9:
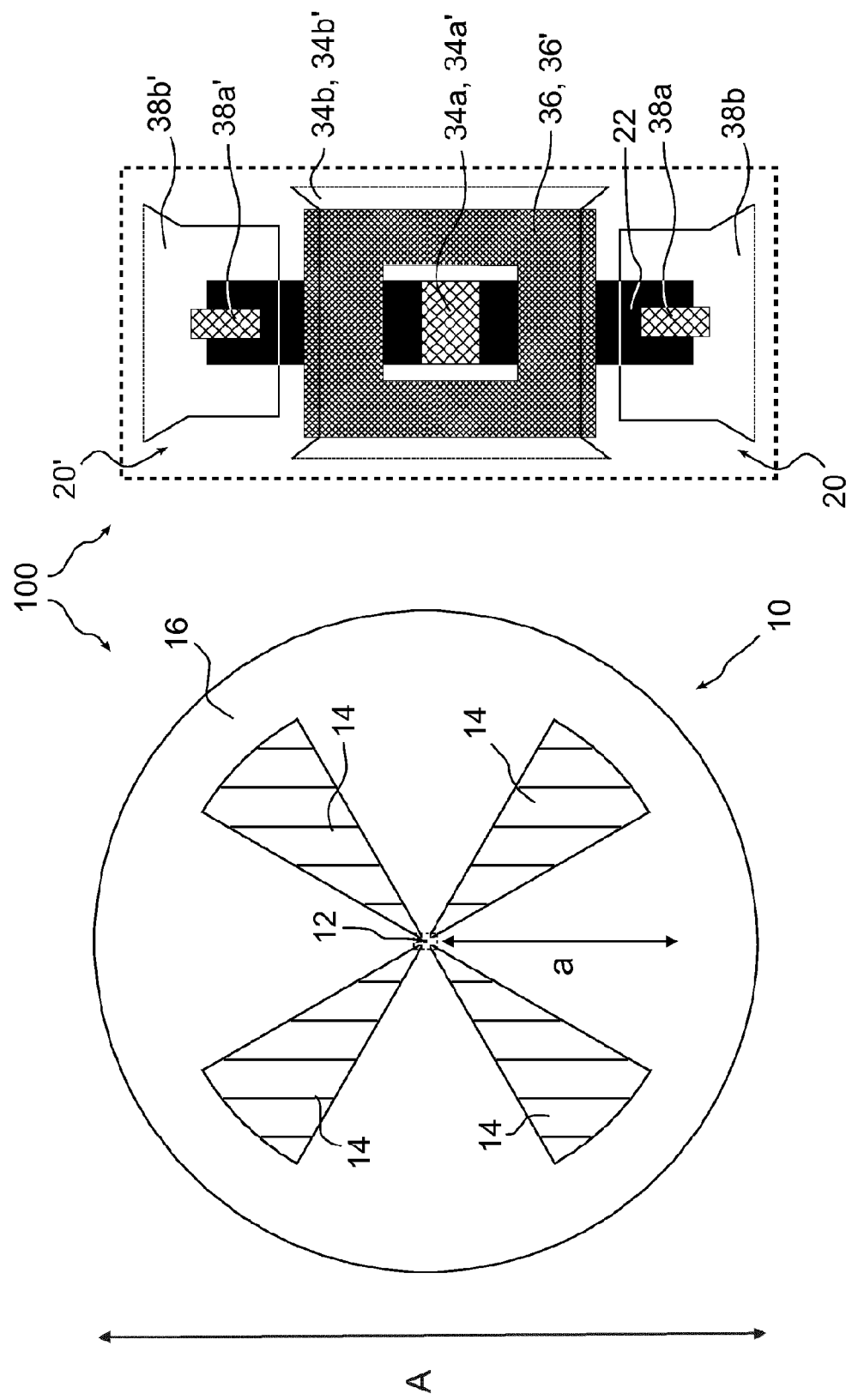
FIG. 9 shows a schematic design of a seventh embodiment of the invention (slot bowtie antenna, 4-armed)

FIG. 9 shows a schematic design of a seventh embodiment of the invention (slot bowtie antenna, 4-armed). The basic design of the shown antenna structure 10 corresponds essentially to the antenna type shown in FIG. 7. The reference signs and their assignment apply accordingly. In contrast to the FIG. 7, however, this embodiment is not a 2-armed antenna structure (two openings 14 are symmetrically arranged around the base point 12 of the antenna structure 10), but rather a 4-armed arrangement of the structural elements is present here (four openings 14 are symmetrically arranged around the base point 12 of the antenna structure 10). For a better visualization of the structure, the region of the openings 14 is displayed hatched. The also drawn abstract schematic representation of the FET structures 20, 20' enlarged from the inner region of the antenna structure 10 represents a preferred embodiment for a corresponding arrangement of two FET structures 20, 20' connected in parallel. Both FET structures 20, 20' can in particular be arranged on a common substrate 70, wherein the antenna structure 10 is formed directly by the electrode structures 34, 34', 38, 38'. Preferably an epitaxial structure (e.g. the epitaxial structure shown in FIG. 1a) is arranged between the antenna structure and the substrate.

In the shown design, the two FET structures 20, 20' form a common 2DEG 22. In addition, both FET structures 20, 20' have a common source electrode structure 34, 34' (i.e. common ohmic source contacts 34a, 34a' and source metallizations 34b, 34b'). The drain electrode structure 38 (comprising an ohmic drain contact 38a and a drain metallization 38b) of the first FET structure 20 as well as the drain electrode structure 38' (comprising an ohmic drain contact 38a' and a drain metallization 38b') are arranged respectively at the ends of the 2DEG 22. The respective gate regions 26, 26' of the two FET structures 20, 20' are electrically conductively connected to each other via a common gate electrode structure 36, 36'.

In accordance with the invention, the gates of the two FET structures 20, 20' completely enclose the common source electrode structure 34, 34' in a first plane E1 (double enclosure) via a common gate electrode structure 36, 36', wherein the enclosed common source electrode structure 34, 34' extends up to above the gate electrode structure 36, 36' (which electrically conductively connects the two gate regions 26, 26' of the two FET structures 20, 20' with each other) and there overlaps the (double) enclosure in a second plane E2 above the first plane E1 at least in sections in a planar manner, wherein between the regions of said gate electrode structure 36, 36' overlapped by the common source electrode structure 34, 34' an electrically insulating region 42 for forming a capacitor 40 with a MIM structure is arranged.

Figure 10:
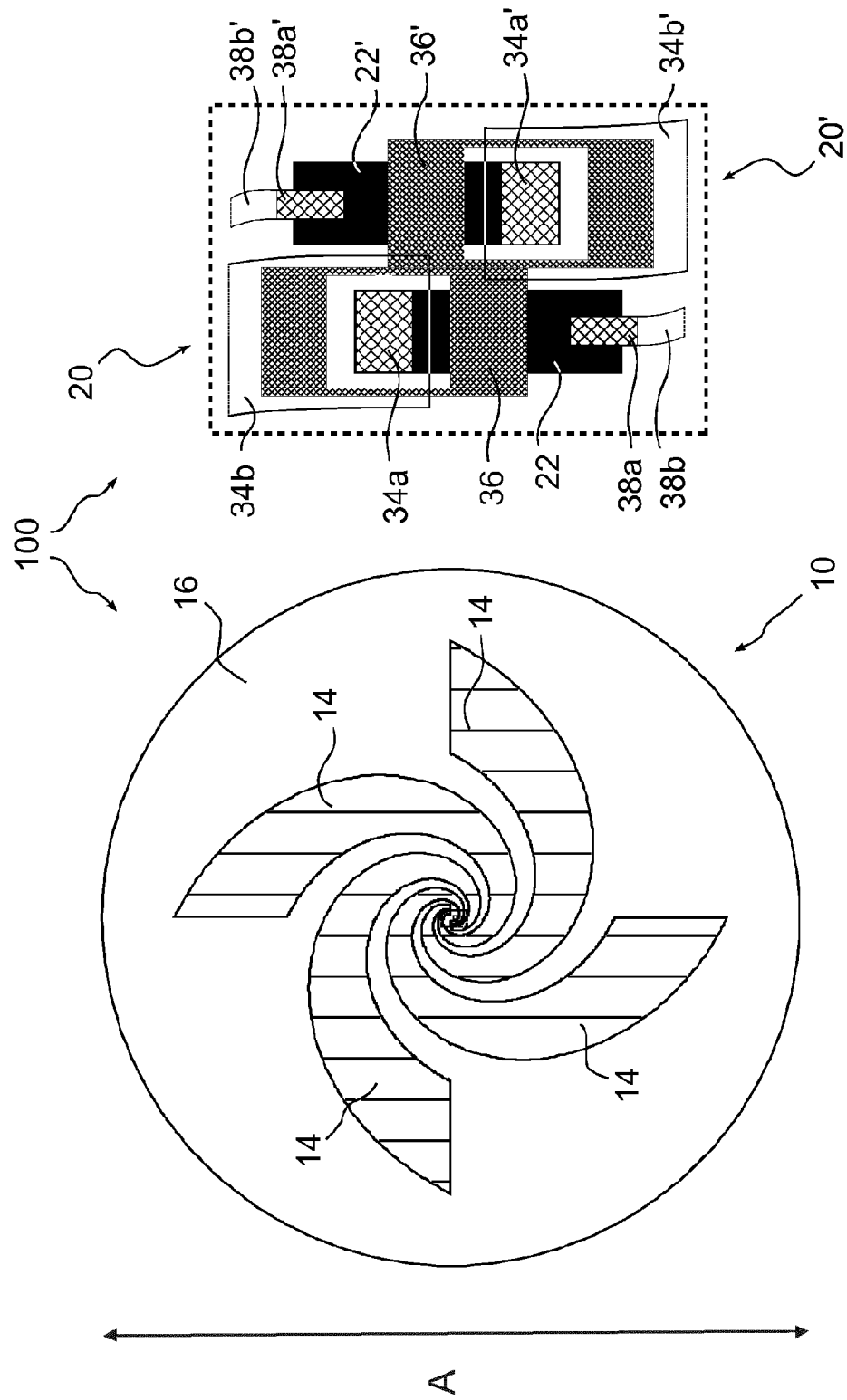
FIG. 10 shows a schematic design of an eighth embodiment of the invention (slot log spiral antenna, 4-armed).

FIG. 10 shows a schematic design of an eighth embodiment of the invention (slot log spiral antenna, 4-armed). The basic design of the shown antenna structure 10 corresponds essentially to the antenna type shown in FIG. 8. The reference signs and their assignment apply accordingly. In contrast to the FIG. 8, however, this embodiment is not a 2-armed antenna structure (two openings 14 are symmetrically arranged around the base point 12 of the antenna structure 10), but rather a 4-armed arrangement of the antenna elements is present here (four openings 14 are symmetrically arranged around the base point 12 of the antenna structure 10). For a better visualization of the spiral structure, the region of the openings 14 is displayed hatched. The also drawn abstract schematic representation of the FET structures 20, 20' enlarged from the inner region of the antenna structure 10 represents a preferred embodiment for a corresponding arrangement of two FET structures 20, 20' connected in parallel. Both FET structures 20, 20' can in particular be arranged on a common substrate 70, wherein the antenna structure 10 is formed directly by the electrode structures 34, 34', 38, 38'. Preferably an epitaxial structure (e.g. the epitaxial structure shown in FIG. 1a) is arranged between the antenna structure and the substrate.

In the shown embodiment, the two FET structures 20, 20' are arranged directly next to each other. These are mutually independent FET structures 20, 20', wherein the gate regions 26, 26' of the two FET structures 20, 20' are electrically conductively connected with each other via a common gate metallization 36, 36'. MIM capacitors 40 are formed in both FET structures 20, 20' respectively by a part of the gate electrode structure 36, 36' through a region overlapping a part of the source electrode structure 34, 34'.

REFERENCE LIST

10 Antenna structure
12 Base point
14 Opening
16 Metal surface
18 Outer edge
20 FET structure
22 2DEG
24 Source region
26 Gate region
28 Drain region
34 Source electrode structure
34a Ohmic source contact
34b Source metallization
36 Gate electrode structure
38 Drain electrode structure
38a Ohmic drain contact
38b Drain metallization
40 Capacitor
42 Electrically insulating region
70 Substrate
72 Buffer layer
74 Active area
76 Insulation layer
77, 78, 79 Passivation layers
100 Radiation detector
A, B Antenna sections
a, b Opening sections
E1 First plane
E2 Second plane

The invention claimed is:
1. A radiation detector comprising:
 a) an antenna structure; and
 b) a field effect transistor (FET) structure having a source region, a gate region, and a drain region,
 c) wherein the source region, the gate region, and the drain region are arranged on a substrate and form mutually independent electrically conductive electrode structures by metallization;
 wherein
 d) the gate electrode structure completely encloses the source electrode structure or the drain electrode structure in a first plane (E1);
 e) the enclosed source or drain electrode structure extends up to above the gate electrode structure and overlaps at least a region of the gate electrode structure in a planar manner, in a second plane (E2) above the first plane (E1);

f) wherein an electrically insulating region for forming a capacitor with a metal-insulator-metal (MIM) structure is arranged between at least the region of the gate electrode structure overlapped by the enclosed source or drain electrode structure and the enclosed source or drain electrode structure.

2. The radiation detector according to claim 1, wherein the antenna structure, placed on the substrate, is directly formed by the source, gate, and drain electrode structures.

3. The radiation detector according to claim 1, wherein the gate electrode structure in the first plane (E1) and the enclosed source or drain electrode structure in the second plane (E2) overlap and overlapped surfaces of the gate electrode structure and the enclosed source or drain electrode structure are essentially in rectangular shape.

4. The radiation detector according to claim 1, wherein the FET structure is based on silicon or a III-V semiconductor.

5. The radiation detector according to claim 1, wherein a base point of the antenna structure is arranged between the gate region and the source region or between the gate region and the drain region.

6. The radiation detector according to claim 1, wherein the antenna structure forms a slot antenna and has at least one radiating opening within a metal surface.

7. The radiation detector according to claim 1, wherein on an outer edge of the antenna structure radio frequency (RF) currents with frequencies greater than 100 GHz are short-circuited.

8. The radiation detector according to claim 1, wherein the antenna structure realizes an RF short-circuit between two regions of the source, gate, and drain regions of the FET structure.

9. The radiation detector according to claim 1, wherein the antenna structure is formed in a two-armed or four-armed manner.

10. The radiation detector according to claim 1, comprising at least two FET structures connected in parallel on the substrate.

11. The radiation detector according to claim 1, wherein the capacitor and the antenna structure form a common RF environment adapted to tune the radiation detector to the reception of electromagnetic waves in a THz range.

12. The radiation detector according to claim 1, further comprising a frequency converter, wherein the frequency converter converts received radiation into a low-frequency detection signal.

13. A method for manufacturing a radiation detector comprising:
providing a field effect transistor (FET) structure arranged on a substrate having a gate region, a source region, and a drain region;
metallizing of the gate region, of the source region, and of the drain region, thereby forming mutually independent electrically conductive electrode structures, wherein, by the gate electrode structure, either the source electrode structure or the drain electrode structure is completely enclosed in a first plane (E1), wherein the enclosed source or drain electrode structure is extended up to above the gate electrode structure and at least a region of the gate electrode structure is overlapped with the enclosed source or drain electrode structure in a planar manner, in a second plane (E2) above the first plane (E1), wherein an electrically insulating region for forming a capacitor with a metal-insulator-metal (MIM) structure is arranged between at least the regions of the gate electrode structure overlapped by the enclosed source or drain electrode structure and the enclosed source or drain electrode structure; and
structuring of an antenna structure arranged on the substrate, wherein the antenna structure, placed on the substrate, is formed directly by the source, gate, and drain electrode structures, wherein a radiating opening is formed within a metal surface of the antenna structure, and wherein a base point of the antenna structure is arranged between the gate region and the source region or between the gate region and the drain region.

14. The method according to claim 13, wherein the antenna structure is formed in a two-armed or four-armed manner.

15. The method according to claim 13, wherein the capacitor and the antenna structure are tuned in their resonant frequencies to reception of electromagnetic waves in a THz range in order to form a common RF environment.

* * * * *